US 6,711,813 B1

(12) United States Patent
Beyne et al.

(10) Patent No.: US 6,711,813 B1
(45) Date of Patent: Mar. 30, 2004

(54) METHOD FOR FABRICATING A THIN FILM BUILD-UP STRUCTURE ON A SEQUENTIALLY LAMINATED PRINTED CIRCUIT BOARD BASE

(75) Inventors: Eric Beyne, Leuven (BE); Francois Lechleiter, Marange-Silvange (FR)

(73) Assignee: Interuniversitair Microelektronica Centrum, Leuven (BE)

(*) Notice: Subject to any disclaimer, the term of this patent is extended or adjusted under 35 U.S.C. 154(b) by 250 days.

(21) Appl. No.: 09/707,311

(22) Filed: Nov. 6, 2000

Related U.S. Application Data

(60) Provisional application No. 60/163,666, filed on Nov. 5, 1999.

(51) Int. Cl.[7] ................................................ H01K 3/10
(52) U.S. Cl. ............................ 29/852; 29/846; 427/97; 427/99
(58) Field of Search ..................... 29/846, 852; 427/97, 427/99

(56) References Cited

U.S. PATENT DOCUMENTS

| | | | | |
|---|---|---|---|---|
| 5,271,150 A | * | 12/1993 | Inasaka | ........................ 29/852 |
| 5,672,226 A | | 9/1997 | Deardorf | |
| 6,378,201 B1 | * | 4/2002 | Tsukada et al. | ................ 29/852 |
| 6,486,394 B1 | * | 11/2002 | Schmidt et al. | ................ 174/36 |

FOREIGN PATENT DOCUMENTS

| | | | | |
|---|---|---|---|---|
| JP | 6-268371 | * | 9/1994 | ................... 29/852 |
| JP | WO 98/47332 | | 9/1998 | ................... 29/852 |
| JP | 11266084 | | 9/1999 | |

OTHER PUBLICATIONS

"Producing Very Thin Glass–Free Dielectric Layers," *IBM Technical Disclosure Bullentin*, vol.: 35 (3), pp. 193–194, Aug. 1992.

* cited by examiner

*Primary Examiner*—Richard Chang
(74) *Attorney, Agent, or Firm*—McDonnell Boehnen Hulbert & Berghoff

(57) ABSTRACT

Method and apparatus of fabricating a core laminate Printed Circuit Board structure with highly planar external surfaces is provided. A pre-formed flat material including a first resinous sub-material and a second carrier sub-material is used to planarize external surfaces. During lamination, uniform pressure is applied to the pre-formed flat sheet which covers the upper surface of the printed circuit. The resinous material of the first sub-material flows to fill the crevices, vias, etc. of the upper surface of the PCB. Moreover, due to the uniform pressure on the pre-formed flat sheet, the resinous first sub-material is planarized. This planarized surface provides a suitable base substrate for a thin film multilayer build-up structure and that provides electrical connections between the thin film top layers and the Printed Circuit Board—style core layers.

8 Claims, 12 Drawing Sheets

METHOD FOR FABRICATING A THIN FILM BUILD-UP STRUCTURE ON A SEQUENTIALLY LAMINATED PRINTED CIRCUIT BOARD BASE

REFERENCE TO RELATED APPLICATIONS

This application claims priority benefits to the U.S. provisional application Serial No. 60/163,666 filed on Nov. 5, 1999. This application incorporates by reference in its entirety the U.S. provisional application Serial No. 60/163,666 filed on Nov. 5, 1999.

FIELD OF THE INVENTION

The present invention is related to a method of fabricating a core laminate Printed Circuit Board.

BACKGROUND OF THE INVENTION

Requirements for higher reliability, better performance and lower system cost are the driving forces behind the current development of new high density packaging (HDP) technologies and miniaturized electronic systems. Different technological approaches are available to achieve high density interconnection structures. These are generally based on improvements on existing technology, such as printed circuit board, co-fired ceramic or thin film technology. Each of these technologies has their specific merits and drawbacks.

When it comes to achieving the highest interconnection density with the best electrical performance, the multilayer thin film technology is now generally accepted as the highest performance technology. A very dense interconnection pattern can be realised using only two fine-line routing layers. These thin film structures are generally produced on silicon, glass, ceramic or even metallic substrates that have only a function as carrier for the thin film layers. After assembly of the die on such a substrate, the substrate itself needs to be packaged. This is an important disadvantage, compared to laminate or ceramic high density interconnect substrates. These can be considered as ball-grid-array "interposer" substrates, therefore not requiring any additional packaging, except for overmoulding and solder-ball attachment.

Printed Circuit Boards fabricated by laminate technology use thick metal lines (e.g., 20 to 60 micron thick conductors) as interconnect lines and thick dielectric layers (e.g., 25 to 100 micron) as interlayer isolators. Thin film technology on the other hand uses thin metal lines (e.g., 2 to 5 micron thick conductors) and thin dielectric layers (e.g., 5 to 10 micron thick MCM-D dielectrics). Feature sizes of lines and spaces in this technology can easily go down to 20 or even 10 $\mu$m. Therefore, the metal and dielectric thicknesses can be an order of magnitude larger in PCB technology than in thin film technology. The laminate should thus also be sufficiently planar on a local scale in order to allow for a reliable coating with thin film layers. This requires planarisation.

Previous techniques at planarization have not been adequate. For example, resins have been applied to the PCB surface in order to planarize the surface; however, these efforts have proven complicated and at time ineffective. Specifically, prior efforts have attempted to drop the resinous material onto the center of the surface of the PCB while the PCB is spinning. Due to centrifugal force, the resinous material is spread on the upper surface of the PCB. This method, however, is complicated in its processing. Moreover, the resinous material on the upper surface of the PCB may not be entirely planar.

AIMS OF THE INVENTION

An aim of the invention is to manufacture a core laminate printed circuit board structure with highly planar external surfaces.

Another aim of the invention is to provide a printed circuit board that has a suitable base substrate for a thin film multilayer build-up structure.

Still another aim of the invention is to provide a printed circuit board that has electrical connections between the thin film top layers and the printed circuit board style core layers.

SUMMARY OF THE INVENTION

The present invention is related to a method of fabricating a core laminate printed circuit board structure with highly planar external surfaces. The proposed method comprises the use of a pre-formed flat material adhered to a printed circuit board (PCB). In one embodiment, the pre-formed flat material is in the form of a sheet and includes at least two types of sub-materials that abut one another. The first sub-material is a resinous or viscous substance that has the ability to flow during lamination. The second sub-material is, in one embodiment, a sacrificial layer and only serves as a carrier for the first sub-material. The second sub-material is not a resinous or viscous substance and does not have the ability to flow during lamination. In one embodiment, the pre-formed flat material is a thin Resin Coated Copper (RCC) foil. The RCC foil is formed in sheets with a first sub-material of resin (or other material which flows during lamination) and with a second sub-material of copper (or other conductor).

In one embodiment, the method includes laying a sheet of the pre-formed flat material on the PCB, with the first sub-material coming into contact with the upper surface of the PCB. The upper surface of the PCB may not be planar, due to crevices, vias, etc. The pre-formed flat sheet sits on the upper surface of the PCB with the first sub-material not filling the crevices, vias, etc. For at least for a part of the time during lamination, uniform pressure is applied to the pre-formed flat sheet which covers the upper surface of the PCB. In one embodiment, the uniform pressure is applied using iron plates during lamination. Therefore, the resinous material of the first sub-material flows to fill the crevices, vias, etc. of the upper surface of the PCB. Moreover, due to the uniform pressure on the pre-formed flat sheet, the resinous first sub-material is planarized.

After lamination, the second sub-material may be removed completely or removed partially. In a preferred embodiment, wherein the material is an RCC foil, the second sub-material (e.g., copper layer), covering the RCC foil, serves as a sacrificial layer and can be removed, such as by etching, thereby leaving an entirely planar or substantially planar epoxy surface. In an alternate embodiment, the second sub-material (e.g., copper layer) can also be patterned as an interconnect layer. In addition, in one embodiment, more than one RCC foil can be subsequently applied.

These and other advantages of the invention will be more apparent to one of the ordinary skill in the art after reading the detailed description section with references to the accompanying drawings.

DETAILED DESCRIPTION OF EXEMPLARY EMBODIMENTS

For the purpose of teaching of the invention, preferred embodiments of the method are described in the sequel. It will be apparent to the person skilled in the art that other alternative and equivalent embodiments of the invention can be conceived and reduced to practice without departing from the true spirit of the invention.

Figure 1:
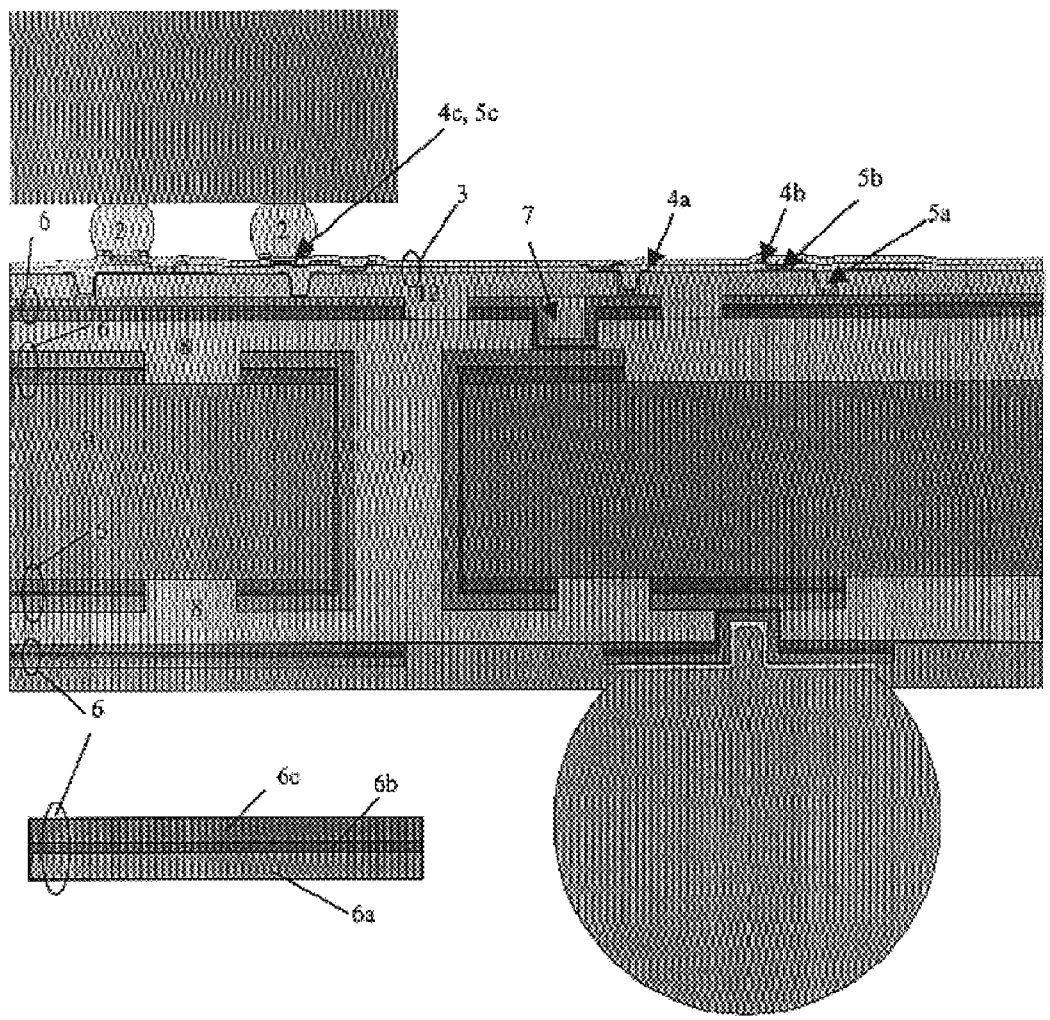
FIG. 1 shows a schematic drawing of a cross-section of an MCM-SL/D substrate according to an embodiment of the present invention.

In one aspect of the invention, a planar intermediate border layer is created between a Printed Circuit Board and layers applying thin film technology. Referring to FIG. 1, there is shown a schematic drawing of a cross-section of an MCM-SL/D substrate according to an embodiment of the present invention. On a printed circuit board (PCB), comprising a core layer (9) in which vias (10) are defined to connect front and backside of the PCB, conductive (6) and insulating layers (8) are deposited using resin coated copper (RCC) foils. Large vias (7) are present to connect the conductive layers (6). The conductive layers can comprise a cladding layer (6a), a seed layer (6b) and a plated layer (6c), as shown in FIG. 1.

Figure 2:
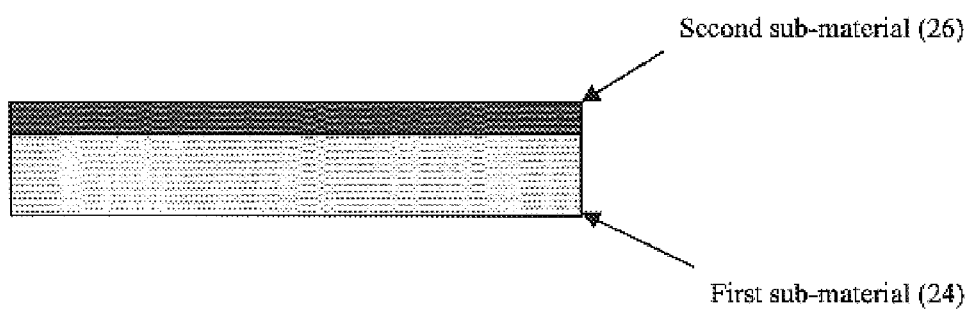
FIG. 2 is a cross section of one example of the pre-formed flat material.

On an upper surface of the PCB is a planar intermediate border layer. The intermediate border layer may be formed on different levels of the structure. For example, as shown in FIG. 1, the planar intermediate border layer is a resin layer (12). Alternatively, one may consider resin layer (8) as an intermediate border layer. Referring to FIG. 2, there is shown a cross section of one example of the pre-formed flat material. In one embodiment, the flat material is pre-formed, in the form of a sheet and includes at least two types of sub-materials that abut one another. The first sub-material is a resinous or viscous substance that has the ability to flow during lamination. The second sub-material is, in one embodiment, a sacrificial layer and only serves as a carrier for the first sub-material. The second sub-material is not a resinous or viscous substance and does not have the ability to flow during lamination. In one embodiment, the pre-formed flat material is a thin Resin Coated Copper (RCC) foil. The RCC foil is formed in sheets with a first sub-material of resin (or other material which flows during lamination) and with a second sub-material of copper (or other conductor).

Referring to FIG. 2, there is shown a first sub-material 24. In a preferred embodiment, the first sub-material 24 is a resin. The first sub-material may be composed of a single type of resin or a multitude of resin types. For example, in a preferred embodiment, the first sub-material (24) is a stack of non-polymerised layers (i.e., layers with a different degree of polymerization). An example of a stack of resins includes a "C" type resin (with almost 50% degree of polymerization) and a "B" type resin with a thickness of 70 μm. Typically, the resin in contact with the upper surface of the PCB is less polymerized. Alternatively, the first sub-material may be composed of a single type of resin (e.g., type "B"). The second sub-material in one embodiment, is a copper layer, 17 μm in thickness. The second sub-material acts as a rigid carrier, allowing for the handling of the resinous first sub-material, and can withstand the isostatic pressure used during processing.

As shown in FIG. 1, the top surface of the PCB is not planar. This is due to vias (such as large via (7)), crevices, etc. Resins act to planarize an upper surface of the PCB so that the surface on top of the upper surface of the PCB is planar or substantially planar. For example, resin (8) layer planarizes an upper surface of the PCB. As an additional example, resin layer (12) planarizes an upper surface of the PCB as well. In this resin layer (12), smaller vias (5a) are defined. Because the resin layer planarizes the surface, other layers may be built on the resin layer. In one embodiment, thin film layers are deposited on top of the resin layer. For example, as shown in FIG. 1, a first thin film metal layer stack (4a) is created and patterned. Other layers may be formed on top of the first thin film layer. As shown in FIG. 1, dielectric layers (3) are deposited on top of the first thin film layer. A second thin film metal layer stack (4b) is created and patterned to form an interconnect pattern in the Y-direction. The conductive layers are connected by means of openings, vias (5c) defined in the conductive layers. A sequence of thin film conductive and dielectric layers can be applied. The conductive layers are connected by means of openings, such as vias defined in the conductive layers.

In one embodiment, the thin film metal layer (4) is deposited first on the substrate by pattern plating on a sputtered seed layer. This technique comprises the following steps:

1. sputtering of a thin seed layer, e.g. 30 nmTi, 200 nm Cu
2. deposition and patterning of a resist layer, e.g. 15 μm AZ4562
3. electroplating Copper in the thus formed pattern
4. Stripping of the resist layer
5. Etch-back (wet) of the Ti/Cu seed layer.

On this layer, thin film dielectric layers (3) may be applied in order to create multilayer structures or solder mask layers. This layer can be of different types, and is preferably low curing materials. Examples include SU8 photo-epoxy material (Sotec Microsystems), Ormocer (Hereaus) and Cyclotene (Dow). One technique used for applying this thin film dielectric layer (3) includes:

1. spin coating of the dielectric material
2. pre-bake (drying) of the layer
3. Photo-exposure on a mask aligner
4. Wet development of the layer
5. Hard-bake or curing of the dielectric layer After this step, the metal and dielectric layer process may be alternating repeated.

After the deposition of the appropriate number of layers, the final metal layer can be altered to allow for flip chip, wire-bonding or surface mount assembly. Two main possibilities exist:

1. electrolytic Ni/Au plating: this step is performed after the copper plating, before removing the resist and the etch-back of the seed layer
2. Electroless Ni/Au plating: after finishing the copper tracks, the Ni and Au are selectively plated on all exposed copper surface areas.

In one embodiment, via holes are laser drilled in the epoxy resin in order to provide electrical contacts between the thin film layers and the core of the PCB. Since no copper is present on the top surface of the board, via hole diameters of 50 micron or less may be obtained. The via holes always stop on top of copper tracks. Electroless Ni:P/Au plating can then be used to partially fill the holes and provide a good electrical contact to the thin film metallisation which is deposited on this substrate base. On top of the planar PCB substrate, the thin film layers may be built-up.

For example, FIG. 1 shows a chip (1) which is a flip chip (i.e., positioned upside down), mounted by means of a ball grid array. Two solders balls (2) are shown connecting the chip (1) with the top metal layer of the thin film. Therefore, as shown in FIG. 1, the resin (12) serves as an interface or an intermediate border layer between the thin film stack and the PCB stack as it planarizes the PCB surface.

Figure 6A:
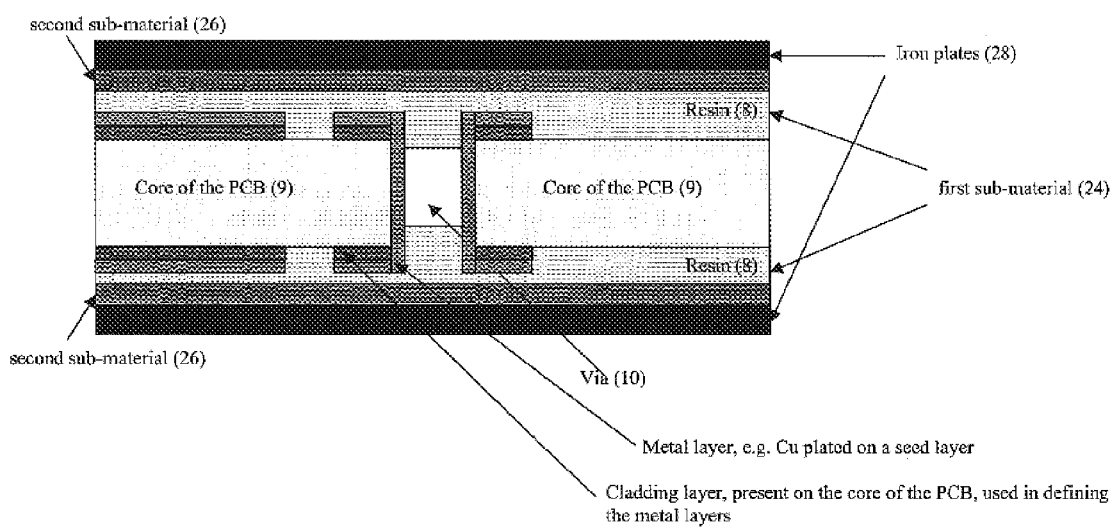
FIG. 6a is a schematic cross-section of a printed circuit board (PCB) of an RCC foil including resin layer (8).

The method includes laying a sheet of the pre-formed flat material on the PCB, with the first sub-material coming into contact with the upper surface of the PCB. Referring to FIG. 6a, there is shown a schematic cross-section of a printed circuit board (PCB) of an RCC foil including resin layer (8) and second sub-material (26). Via (10) is present in the core of the PCB and can be filled with a material having appropriate thermochemical properties. Moreover, the PCB includes a metal layer (e.g., Cu plated on a seed layer). And, a cladding layer, present on the core of the PCB (9) is used to define metal layers. Prior to lamination, the pre-formed flat sheet sits on the upper surface of the PCB with the first sub-material not filling the crevices, vias, etc.

Figure 6B:
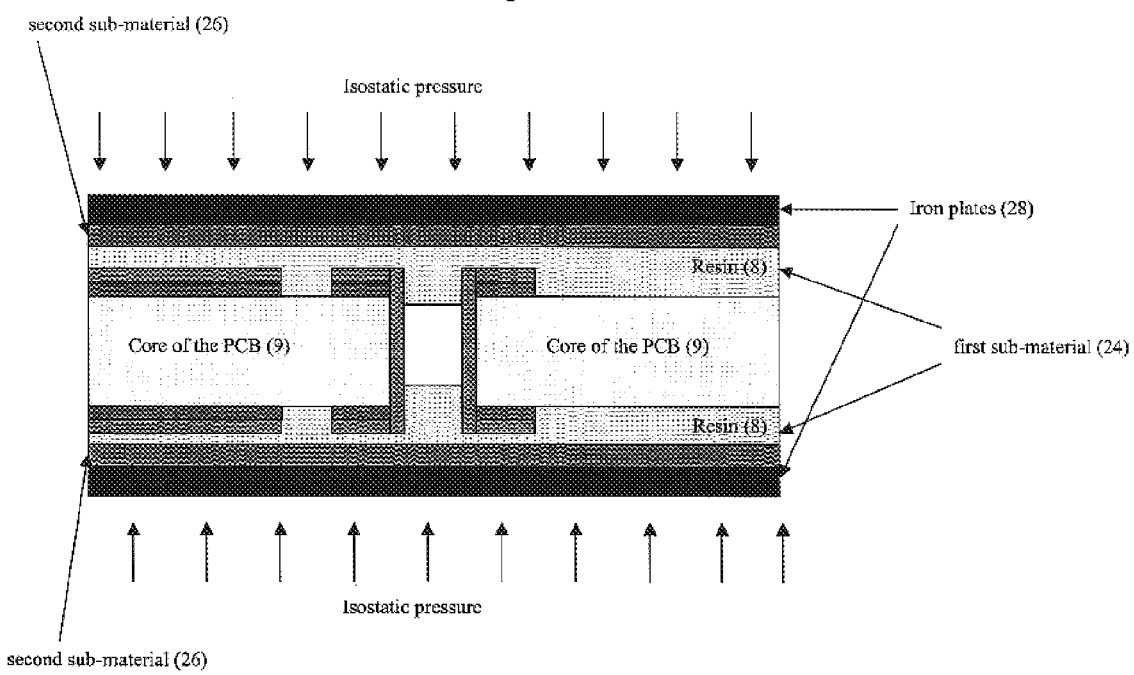
FIG. 6b is the schematic cross-section of a printed circuit board (PCB) in FIG. 6a with isostatic pressure being applied.

Iron plates (28) are placed on both sides of the RCC material, as shown in FIG. 6a. During lamination, the RCC foils are squeezed by the iron plates (28). An isostatic pressure is exerted while heating the whole device in a furnace with a vacuum atmosphere, as shown in FIG. 6b. The vacuum atmosphere assures that no gases and/or moisture is present. The isostatic pressure is constant on the surface of the iron plates. In this manner, resin (8) will flow and will be pushed to fill all openings while a cross-linking/polymerization takes place and the surface of resin (8) which abuts the second sub-material is planarized.

Figure 6C:
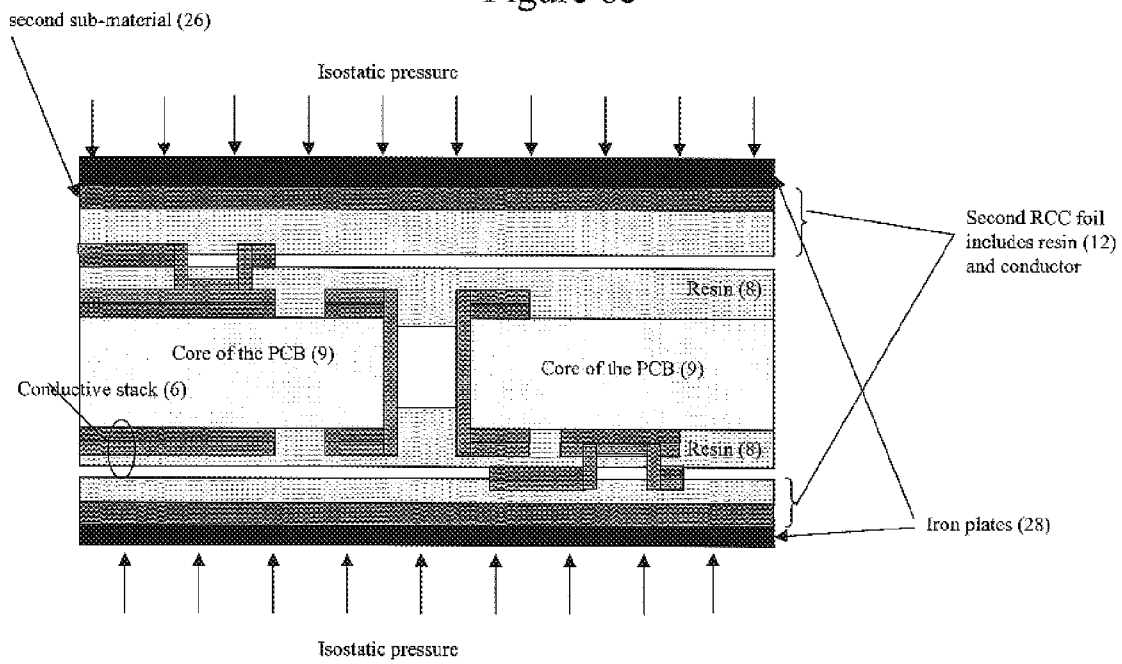
FIG. 6c is the schematic cross-section of a printed circuit board (PCB) in FIG. 6a with a second resin layer (12) being applied using isostatic pressure.

Referring to FIG. 6c, there is shown the schematic cross-section of a printed circuit board (PCB) in FIG. 6a with a second resin layer (12) being applied using isostatic pressure. After lamination, the second sub-material may be removed completely or removed partially, as shown FIG. 6c wherein the second sub-material abutting resin (8) is removed. In a preferred embodiment, wherein the material is an RCC foil, the copper layer, covering the RCC foil, can be removed, such as by etching using a Cu-carrier, leaving an entirely planar or substantially planar epoxy surface. In an alternate embodiment, this copper layer can also be patterned as an interconnect layer. A via and conductor are formed in resin (8). Thereafter, a second RCC foil, which includes resin (12) and conductor, is applied to define a second stack of conductors/dielectrics. Similar to the method of FIG. 6b, during lamination, an isostatic pressure is applied to the second RCC foil using iron plates (28) so that the first sub-material may be pushed into the crevices of the via in resin (8), for example. After which, the surface of the resin which abuts the second sub-material (copper) is substantially planarized.

Figure 6D:
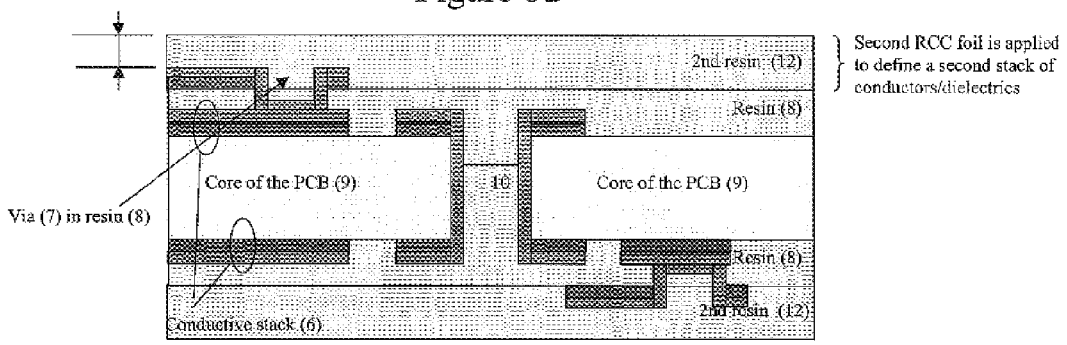
FIG. 6d is the schematic cross-section of a printed circuit board (PCB) in FIG. 6c with conductor layer of second RCC foil removed.
Figure 6E:
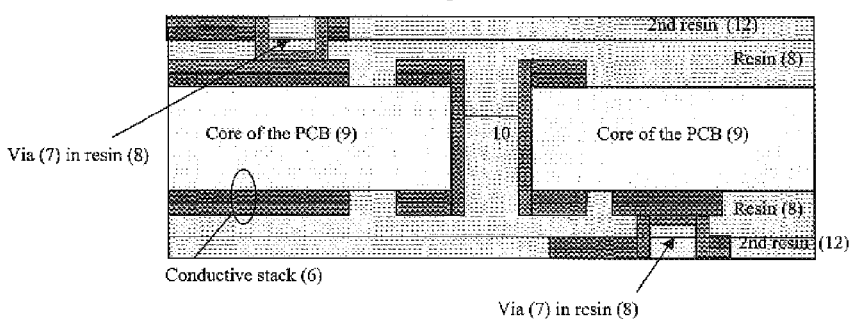
FIG. 6e is the schematic cross-section of a printed circuit board (PCB) in FIG. 6d with second resin layer etched to level of conductor.

Referring to FIG. 6d, there is shown the schematic cross-section of a printed circuit board (PCB) in FIG. 6c with conductor layer of second RCC foil removed. Moreover, the thickness of the resin (12) is adjusted, as discussed in more detail with respect to FIG. 3, for electrical considerations. The resin may be removed by plasma etching. Referring to FIG. 6e, there is shown the schematic cross-section of a printed circuit board (PCB) in FIG. 6d with second resin layer etched to level of conductor. As described in more detail with respect to FIG. 4, the resin (12) is removed, such as by chemical mechanical polishing (CMP) so that the level of the resin is the same as the copper connections.

Figure 3:
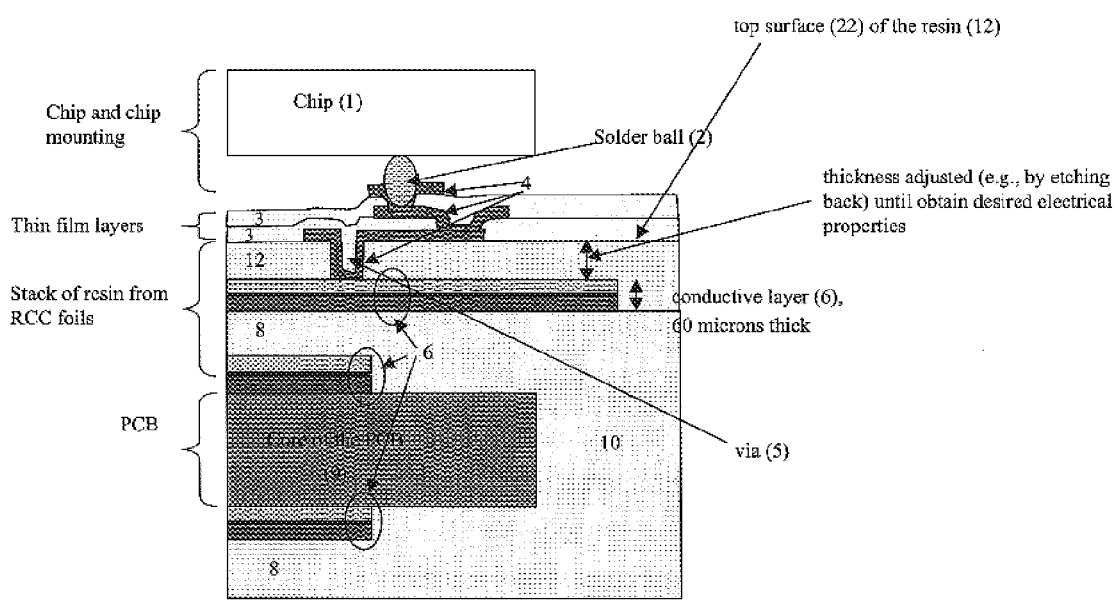
FIG. 3 is a schematic cross-section of a printed circuit board (PCB) in another embodiment of the invention composed of conductive (6) and dielectric layers (8) on a core (9).

Referring to FIG. 3, there is shown a schematic cross-section of a printed circuit board (PCB) in another embodiment of the invention composed of conductive (6) and dielectric layers (8) on a core (9). On top of this PCB-stack, a single resin (12), originating from a resin coated coper (RCC) foil is shown according to one embodiment of the present invention. On top of this resin (12), thin film technology stack is present. Similar to FIG. 1, this thin film technology stack is composed of conductive (4) and dielectric layers (3). A chip (1) is a flip chip, mounted using ball grid array package (2) technique. Via (5) is patterned in resin (12) to connect to the underlying copper conductive material (6). Similar to FIG. 1, the top surface of resin layer 12 is flat and is not conformal with the upper surface of the PCB.

Depending on the desired electrical properties of the intermediate border layer between the PCB and layers applying thin film technology, the thickness of the resin layer(s) is adjusted. For example, if one wishes to perform impedance matching, the thickness of the intermediate border layer may be reduced. For some applications, the available RCC layers may be too thick (the resin of the RCC foil may be too thick), e.g. to realize 50 Ohm impedance interconnect lines on the first thin film layer on this laminate. In order to match the impedance with the first thin film layer, the thickness is reduced. As shown in FIG. 3, the thickness of the conductive layer is 60 microns. In one embodiment, the reduction is performed by plasma-etching the top resin layer until the intermediate border layer is at a desired thickness, e.g., 20 micron.

Figure 4:
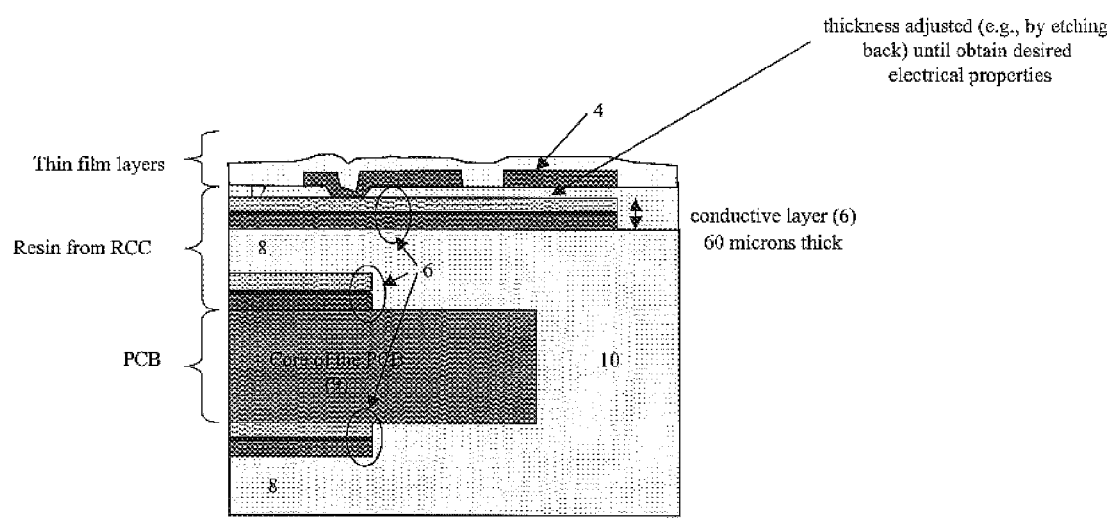
FIG. 4 is a schematic cross-section of a printed circuit board (PCB) in still another embodiment of the invention composed of conductive (6) and dielectric layers (8) on a core (9).

Referring to FIG. 4, there is shown a schematic cross-section of a printed circuit board (PCB) in still another embodiment of the invention composed of conductive (6) and dielectric layers (8) on a core (9). FIG. 4 shows a schematic, similar to FIG. 6d, but with the addition of thin film layers.

Figure 5:
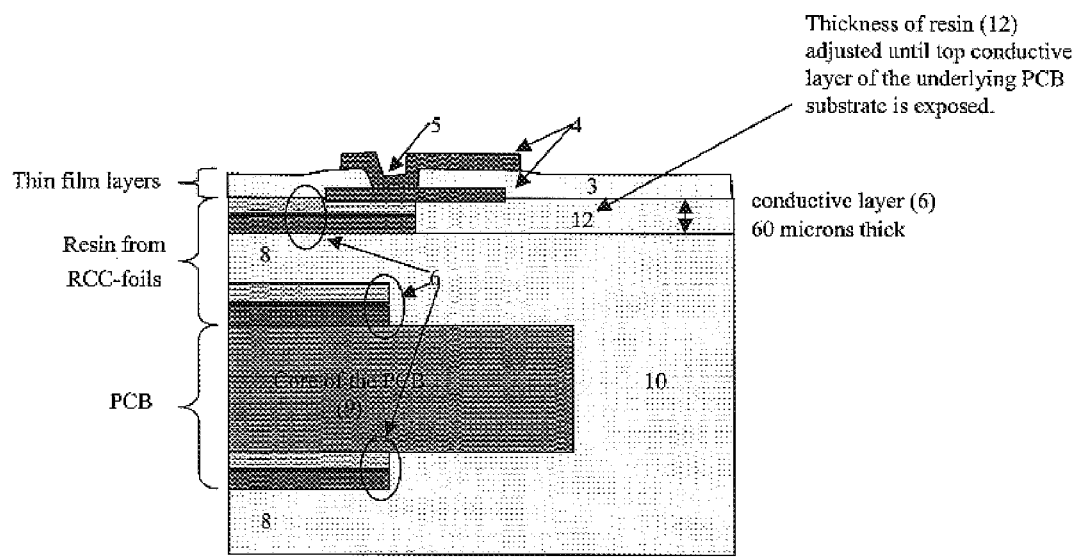
FIG. 5 is a schematic cross-section of a printed circuit board (PCB) in yet another embodiment of the invention composed of conductive (6) and dielectric layers (8) on a core (9).

Referring to FIG. 5, there is shown a schematic cross-section of a printed circuit board (PCB) in yet another embodiment of the invention composed of conductive (6) and dielectric layers (8) on a core (9). Similar to FIG. 3, on top of this PCB-stack is a single resin layer (12). The resin layer (12) originates from a resin coated copper (RCC) foil by the method of FIG. 2. The resin layer is etched back a predetermined amount, according to one embodiment of the present invention, so that the thickness of this resin layer is adapted to meet the electrical specifications. On top of this resin (12), thin film technology stack is present. A first conductive layer (4) is deposited, making direct contact with the top conductive layer of the underlying PCB substrate.

In this embodiment, the resin is used to fill the gaps between the conductive lines of the PCB substrate. Specifically, the resin is first applied so that the upper surface of the resin is a planarized surface, similar to the resin (12) as shown in FIG. 1. In addition, the resin is etched, by for example plasma etching) such that the upper surface of the resin layer will be coplanar with the upper surface of the PCB. As shown in FIG. 5, the resin layer (12) is etched back to be coplanar with conductive layer (6).

The etch-back of the resin will remove the same amount of resin all over the substrate; hence, the flat top surface of the resin prior to etching is transferred to a flat surface of exposed conductive (6) layers and resin (12) in between these conductors after etching. Thus, by having these irregularities (crevices, vias, etc.) filled with resin a substantially flat surface is offered to the next process step. And, this simplifies processing by removing the need for a via through the resin layer (i.e., the via (5) shown in FIG. 3 is not necessary). Conductive layer (4) is deposited on top of the planar resin-conductive layer. And, a first dielectric (3), a via (5) and a second conductive layer (4) are deposited.

Figure 7A:
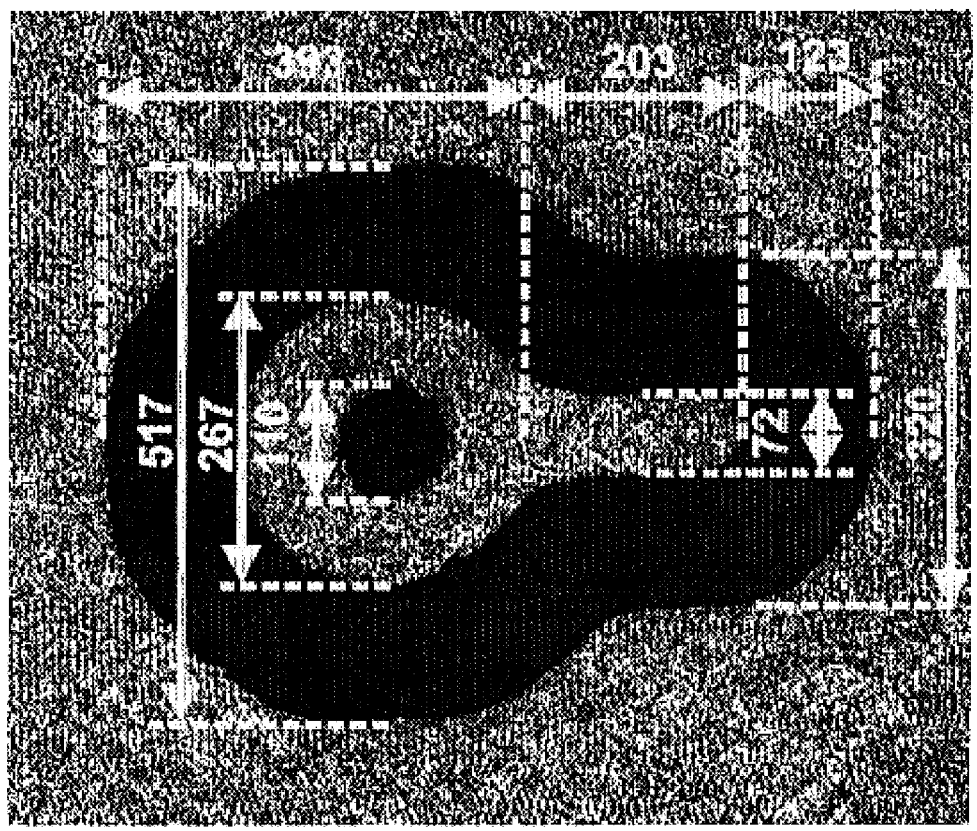
FIGS. 7a and 7b show a photograph top view and cross-section view, respectively, of a planarised "through-hole" connection structure in the laminate core, with a laser drilled via hole and the cut-out from the ground plane.
Figure 7B:
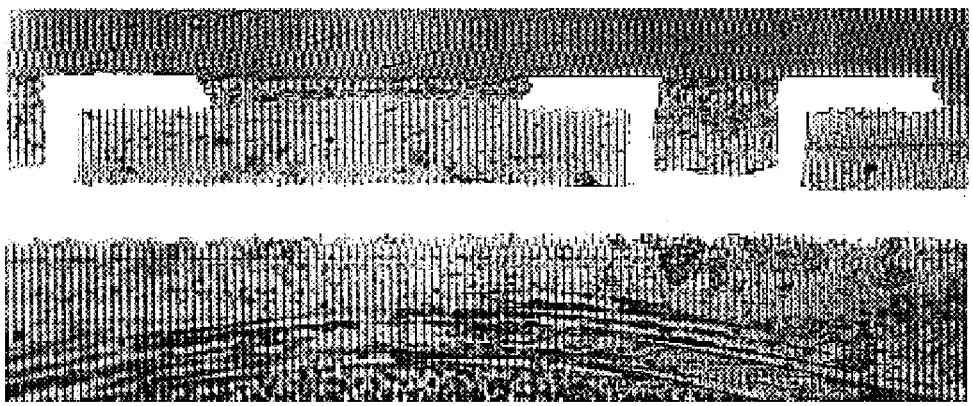

Referring to FIGS. 7a and 7b, there are shown a photograph top view and cross-section view, respectively, of a planarised "through-hole" connection structure in the laminate core, with a laser drilled via hole and the cut-out from the ground plane. As discussed previously, in order to build thin films reliably, the thin films must be on a substantially planarized surface. FIGS. 7a and 7b shown the degree of planarization of a thin film wherein only one resin layer is applied (e.g., only applying a single RCC foil, such as resin (8)). The measured planarisation of a 10 $\mu$m thick photo-sensitive BCB (e.g., level 3 as shown in FIG. 1) over an FR4-PCB copper metallisation pattern (circular pattern of 30 $\mu$m deep, 100 $\mu$m wide circles and gaps) results in a degree of planarisation, DOP, of 33% after a first BCB coating. BCB stands for Benzo Cyclo Buteen, and is Cyclotene™ from DOW. This degree of planarization may not be acceptable.

Figure 8:
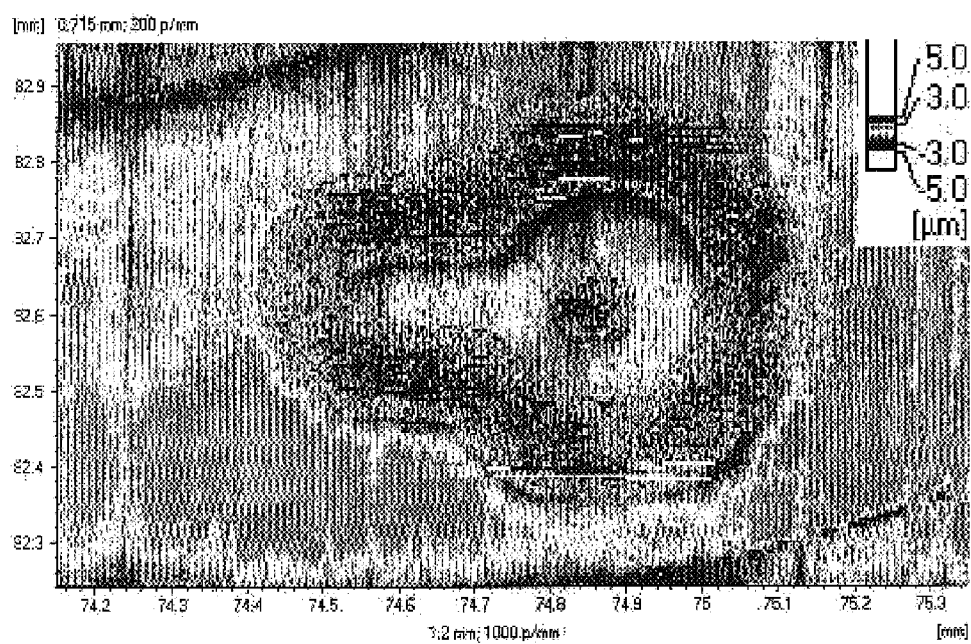
FIG. 8 shows a surface scan of a planarized structure, similar to FIG. 7a, with a second dielectric coating added.

In order to increase the degree of planarization, a second dielectric coating is required. For example, a second RCC foil is added (e.g., resin (12)) to obtain an acceptable DOP of 75–80%, as shown in FIG. 8. Due to the second dielectric coating, a local substrate planarity of ±5 $\mu$m.

Figure 9:
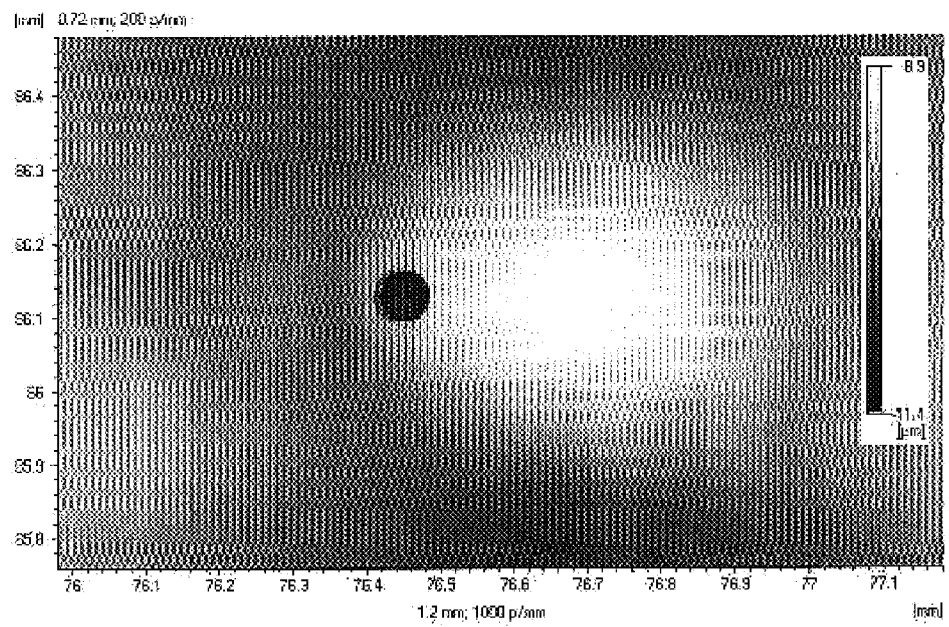
FIG. 9 shows a surface profile after deposition of two 5 μm thick BCB layers.
Figure 10:
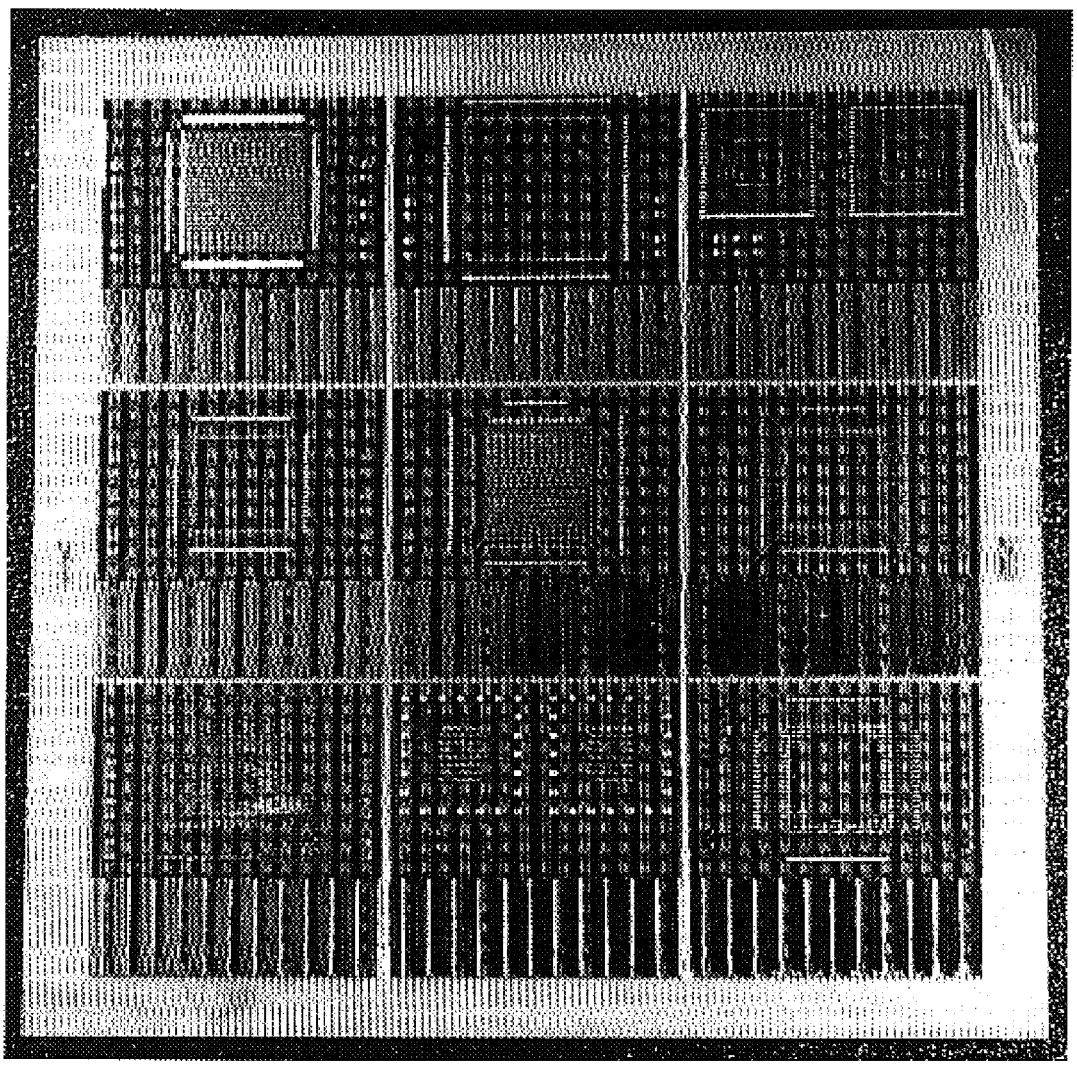
FIG. 10 shows an example of an actual MCM-SL/D substrate, measuring 10×10 cm.

Referring to FIG. 9, there is shown a surface profile after deposition of two 5 $\mu$m thick BCB layers (layer 3 in FIG. 1). As shown in FIG. 9, using two coats of 5 $\mu$m thickness, an excellent surface planarity and smoothness is obtained. Moreover, as shown in FIG. 9, the photo-BCB via is also visible. Referring to FIG. 10, there is shown an example of an actual MCM-SL/D substrate, measuring 10×10 cm.

The claims should thus not be read as limited to the described order or elements unless stated to that effect. Therefore, all embodiments that come within the scope and spirit of the following claims and equivalent thereto are claimed as the invention.

What is claimed is:

1. A method for planarizing an outer surface of a printed circuit board, the method comprising:

placing a pre-formed material on the outer surface of the printed circuit board, the outer surface having at least one of vias and crevices, the pre-formed material including a first sub-material and a second sub-material, the first sub-material being resinous and the second sub-material being non-resinous, the first sub-material being in the form of a sheet, the second sub-material being in the form of a sheet, the first sub-material abutting the second sub-material, the first sub-material abutting the outer surface of the printed circuit board;

applying an isostatic pressure on the pre-formed material, wherein the second sub-material does not deform; and laminating the resinous first sub-material with the outer surface of the printed circuit board for at least a portion of time during which the isostatic pressure is applied, wherein, as a result of laminating, the resinous first sub-material substantially fills the at least one of vias and crevices; and removing the second sub-material completely from the first sub-material after laminating, such that a substantially planar upper surface of the first-sub-material is exposed.

2. The method of claim 1, wherein the second sub-material acts as a carrier for the first sub-material.

3. The method of claim 1, wherein applying isostatic pressure includes applying pressure using a plate which abuts an exposed surface of the second sub-material.

4. The method of claim 1, further comprising substantially uniformly reducing a thickness of the first sub-material over its entire surface area after removing the second sub-material.

5. The method of claim 4, wherein reducing the thickness of the first sub-material includes etching the first sub-material.

6. The method of claim 5, wherein the outer surface of the printed circuit board comprises a conductor layer, and wherein reducing the thickness of the first sub-material includes reducing the thickness of the first sub-material such that the first sub-material is substantially coplanar with an upper surface of the conductor layer.

7. The method of claim 5, wherein reducing the thickness of the first sub-material results in an impedance of one or more signal conductors of the printed circuit board being modified.

8. The method of claim 1, further comprising forming one or more thin film structures on the substantially planar upper surface of the first-sub-material.

* * * * *